United States Patent
Mitsuzawa et al.

(10) Patent No.: US 10,205,039 B2
(45) Date of Patent: Feb. 12, 2019

(54) SOLAR PANEL

(71) Applicants: KABUSHIKI KAISHA TOYOTA JIDOSHOKKI, Kariya-shi, Aichi-ken (JP); TOYOTA JIDOSHA KABUSHIKI KAISHA, Toyota-shi, Aichi-ken (JP)

(72) Inventors: Hideyuki Mitsuzawa, Kariya (JP); Kazumasa Okumura, Kariya (JP); Hirotaka Inaba, Kariya (JP)

(73) Assignees: KABUSHIKI KAISHA TOYOTA JIDOSHOKKI, Kariya-shi, Aichi-ken (JP); TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 15/068,803

(22) Filed: Mar. 14, 2016

(65) Prior Publication Data
US 2016/0276509 A1  Sep. 22, 2016

(30) Foreign Application Priority Data
Mar. 16, 2015 (JP) .................................. 2015-051688

(51) Int. Cl.
*H01L 31/049*  (2014.01)
*H01L 31/048*  (2014.01)
*H01L 31/05*  (2014.01)

(52) U.S. Cl.
CPC .......... *H01L 31/049* (2014.12); *H01L 31/048* (2013.01); *H01L 31/05* (2013.01); *Y02E 10/50* (2013.01)

(58) Field of Classification Search
CPC ............... H01L 31/048–31/0488; H01L 31/05
USPC .................................................. 136/243–265
See application file for complete search history.

(56) References Cited

U.S. PATENT DOCUMENTS 5,660,646 A * 8/1997 Kataoka ............ B32B 17/10018
136/244

FOREIGN PATENT DOCUMENTS

| JP | 1-137554 U | 9/1989 |
| JP | 06-39935 U | 5/1994 |
| JP | 2012-033546 A | 2/2012 |

* cited by examiner

*Primary Examiner* — Niki Bakhtiari
(74) *Attorney, Agent, or Firm* — Sughrue Mion, PLLC (57) ABSTRACT

A solar panel includes a protection plate, a back cover, photovoltaic battery cells, a conductive member that electrically connects the photovoltaic battery cells to one another, and an encapsulant that is integrated with and located between the protection plate and the back cover. The encapsulant encapsulates the photovoltaic battery cells and the conductive member and fixes the photovoltaic battery cells and the conductive member to the protection plate and the back cover. The protection plate includes a resin transparent member, which is translucent from a front surface to a rear surface, and a resin opaque member, which is located at an outer side of each of the photovoltaic battery cells, shields the conductive member, and is arranged on the rear surface of the transparent member and integrated with the transparent member.

3 Claims, 6 Drawing Sheets

SOLAR PANEL

BACKGROUND OF THE INVENTION

The present invention relates to a solar panel.

Japanese Laid-Open Utility Model Publication No. 6-39935 discloses a solar panel that includes a protection plate, a back cover, photovoltaic battery cells, a conductive member, and an encapsulant. The protection plate is formed from inorganic glass. The conductive member electrically connects the photovoltaic battery cells to one another. The photovoltaic battery cells and the conductive member are arranged between the protection plate and the back cover and encapsulated by the encapsulant. The encapsulated photovoltaic cells and conductive member are fixed to the protection plate and the back cover.

In general, the conductive members of a solar panel are formed by metal plates and thus have a metallic color such as silver. Accordingly, when the solar panel is viewed from the front surface of a protection plate, the conductive members are more noticeable than necessary. This adversely affects the aesthetic appeal. In the solar panel of Japanese Laid-Open Utility Model Publication No. 6-39935, a portion of the protection plate that opposes each photovoltaic battery cell is translucent from the front surface to the rear surface. Further, opaque (for example, black) paint is applied to portions in the rear surface of the protection plate that oppose the conductive member. In this manner, the conductive member of the solar panel is shielded by opaque paint to improve the aesthetic appeal.

However, manufacturing of the conventional solar panel requires a process for preparing a transparent protection plate formed from inorganic glass and a process for applying opaque paint to the necessary portions of the protection plate. This increases the manufacturing cost of the protection plate and thus increases the manufacturing cost of the solar panel.

SUMMARY OF THE INVENTION

It is an object of the present invention to provide a solar panel that improves the aesthetic appeal and decreases the manufacturing cost.

A solar panel of the present invention includes a protection plate, a back cover, photovoltaic battery cells, conductive member that electrically connects the photovoltaic battery cells to one another, and an encapsulant that is integrated with and located between the protection plate and the back cover. The encapsulant encapsulates the photovoltaic battery cells and the conductive member and fixes the photovoltaic battery cells and the conductive member to the protection plate and the back cover. The protection plate includes a resin transparent member, which is translucent from a front surface to a rear surface, and a resin opaque member, which is located at an outer side of each of the photovoltaic battery cells, shields the conductive member, and is arranged on the rear surface of the transparent member and integrated with the transparent member.

BRIEF DESCRIPTION OF THE DRAWINGS

FIGS. 3A to 3D are cross-sectional views each showing a method for manufacturing a protection plate of the solar panel of FIG. 1, in which

FIGS. 4A to 4C are cross-sectional views each showing a method for manufacturing the solar panel of FIG. 1, in which

DETAILED DESCRIPTION OF THE PREFERRED EMBODIMENTS

First to third embodiments according to the present invention will now be described with reference to the drawings.

First Embodiment

Figure 1:
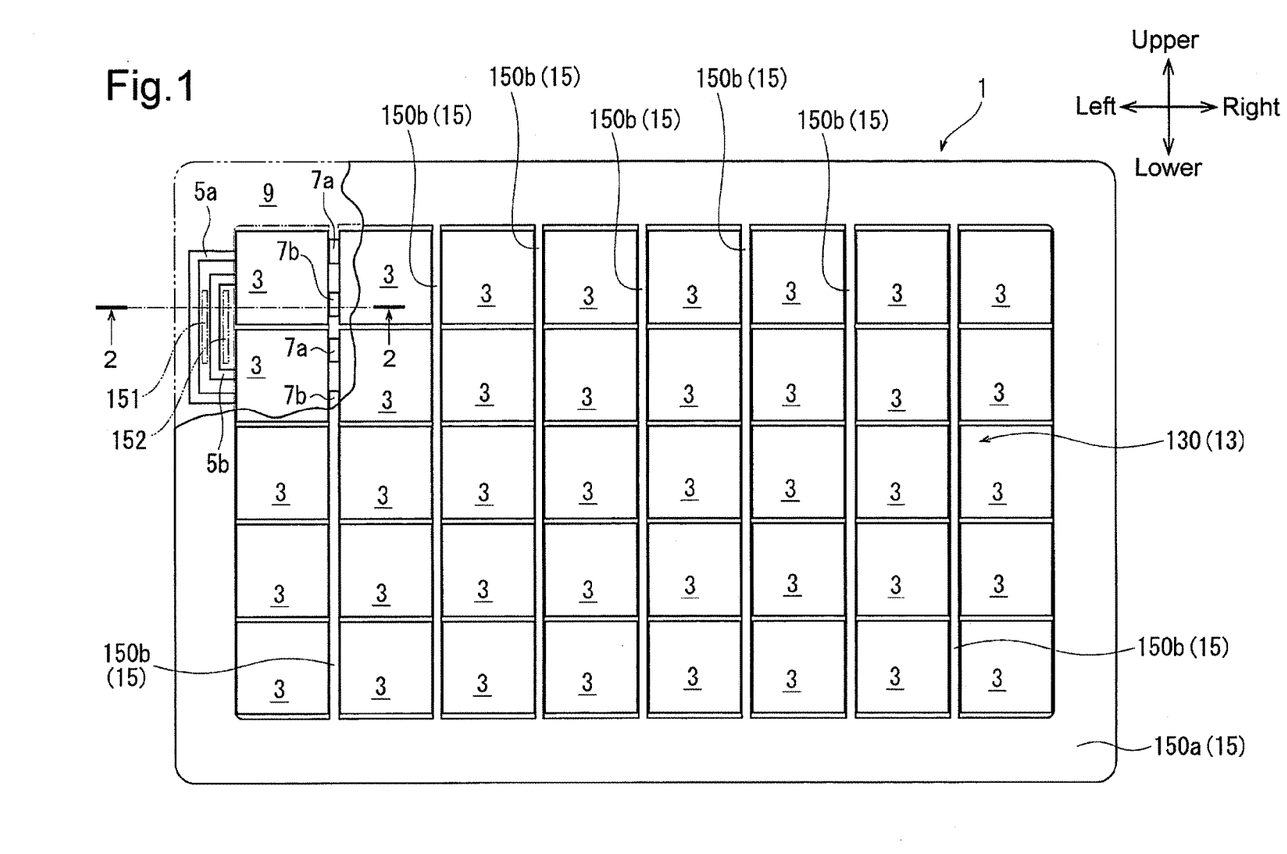
FIG. 1 is a top view showing a solar panel of a first embodiment.
Figure 2:
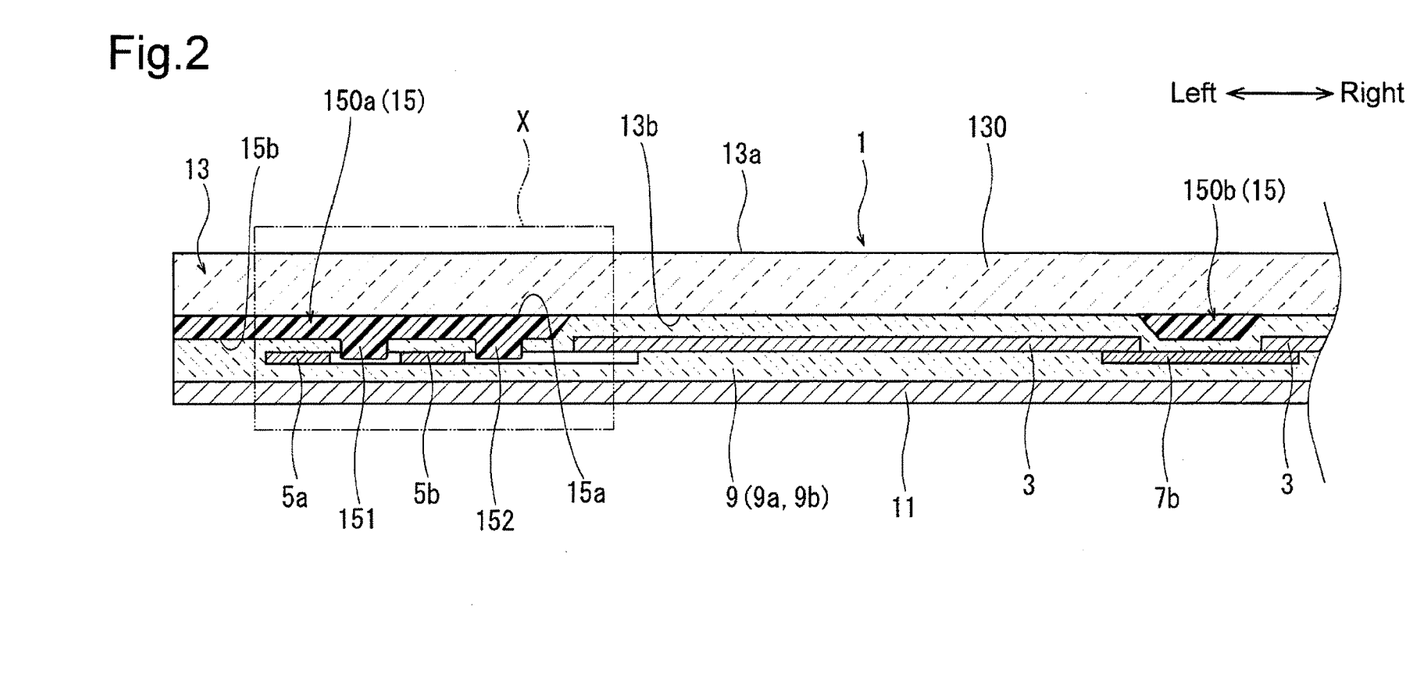
FIG. 2 is an enlarged cross-sectional view taken along line 2-2 in FIG. 1.

As shown in FIGS. 1 and 2, a solar panel of the first embodiment includes a protection plate 1, photovoltaic battery cells 3, tab wires 5a and 5b, interconnectors 7a and 7b, an encapsulant 9, and a back panel 11. The tab wires 5a and 5b and the interconnectors 7a and 7b correspond to conductive members. The back panel 11 corresponds to a back cover. To facilitate understanding, the protection plate 1 is not shown in the portion illustrated by broken lines in FIG. 1. The frame of reference for the description hereafter is indicated by the arrows showing the upper, lower, left, and right directions of the solar panel in FIG. 1 and the arrows showing the left and right directions of the solar panel in FIGS. 2, 6, and 7 in correspondence with FIG. 1. The directions of the solar panel are irrelevant to the directions when using the solar panel.

The protection plate 1 includes a transparent plate 13, which is translucent from a front surface 13a to a rear surface 13b, and a black opaque shield 15. The transparent plate 13 and the shield 15 each contain polycarbonate as a main component. That is, the protection plate 1 is formed from a resin and includes polycarbonate as the main component. The transparent plate 13 corresponds to a transparent member, and the shield 15 corresponds to an opaque member. The shield 15 does not have to be black. Instead, the shield 15 may be in another color as long as the shield 15 is opaque. Further, the transparent plate 13 and the shield 15 may include a resin other than polycarbonate as the main component. In addition, the transparent plate 13 and the shield 15 may be formed from different resins.

As shown in FIG. 1, the transparent plate 13 is tetragonal and flat. The front surface 13a of the transparent plate 13 is a front surface of the protection plate 1. As shown in FIG. 2, the front surface 13a is flat, and the rear surface 13b is flat and parallel to the front surface 13a. The transparent plate 13 includes opposing portions 130 that respectively oppose the photovoltaic battery cells 3.

The shield 15 is arranged on the rear surface 13b of the transparent plate 13 and integrated with the transparent plate 13. That is, the shield 15 is fixed to the rear surface 13b of the transparent plate 13. The shield 15 includes a front surface 15a, which opposes the rear surface 13b of the transparent plate 13, and a rear surface 15b, which opposes the encapsulant 9. The shield 15 includes a body 150a and connection portions 150b.

As shown in FIG. 1, the body 150a is arranged in a region outside the group of the photovoltaic battery cells 3. More specifically, the body 150a is arranged on the transparent plate 13 in a region located outside a group of the opposing portions 130. The body 150a is formed along the rim of the transparent plate 13. The body 150a, which has the form of a frame, surrounds the group of the opposing portions 130. As shown in FIG. 2, ribs 151 and 152, which extend from the rear surface 15b toward the encapsulant 9, are arranged at the left side of the body 150a. As shown in FIG. 1, the ribs 151 and 152 extend straight along the tab wires 5a and 5b. The ribs 151 and 152 are respectively arranged on the rear surface 15b of the left side and the right side of the body 150a. The number of the ribs 151 and 152 correspond to the number of the tab wires 5a and 5b. The ribs 151 and 152 correspond to restriction portions. The forms and positions of the ribs 151 and 152 may be changed as long as the ribs 151 and 152 extend from the rear surface 15b of the body 150a toward the encapsulant 9. The restriction portions do not have to be formed by the ribs 151 and 152. Instead, the restriction portions may be formed by, for example, semispherical projections.

As shown in FIG. 1, each connection portion 150b is located at the inner side of the body 150a. The connection portions 150b extend in the vertical direction (upper-lower direction) of the protection plate 1 and are continuous with the upper portion and the lower portion of the body 150a. The number of the connection portions 150b corresponds to the number of gaps extending between the photovoltaic battery cells 3 that are adjacent in the lateral direction (left-right direction). Further, the size of gaps extending between the connection portions 150b that are adjacent in the lateral direction corresponds to the size of the gaps extending between the photovoltaic battery cells 3 that are adjacent in the lateral direction.

Figure 3A:
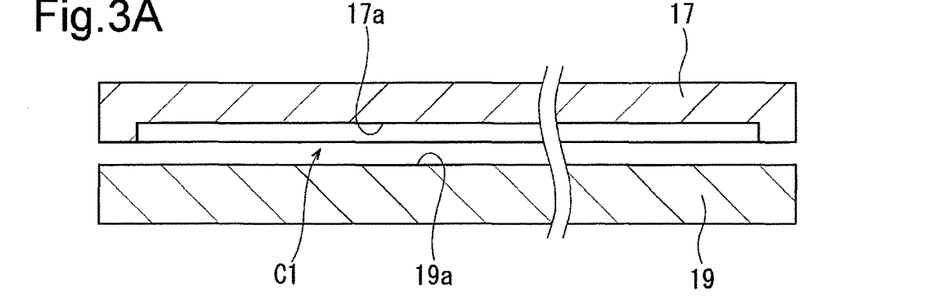
FIG. 3A is a cross-sectional view showing a first molding die and a second molding die.

The protection plate 1 is manufactured as follows. As shown in FIG. 3A, in a first preparation process, a first molding die 17 and a second molding die 19 are prepared.

The first molding die 17 includes a first molding surface 17a that molds the front surface 13a of the transparent plate 13, that is, the front surface of the protection plate 1. The second molding die 19 includes a second molding surface 19a, which opposes the first molding surface 17a and molds the rear surface 13b of the transparent plate 13. When the first molding surface 17a and the second molding surface 19a are opposed to each other and the first molding die 17 and the second molding die 19 are closed, the first molding surface 17a and the second molding surface 19a define a cavity C1. Gates (not shown) are in communication with the cavity C1.

Figure 3B:
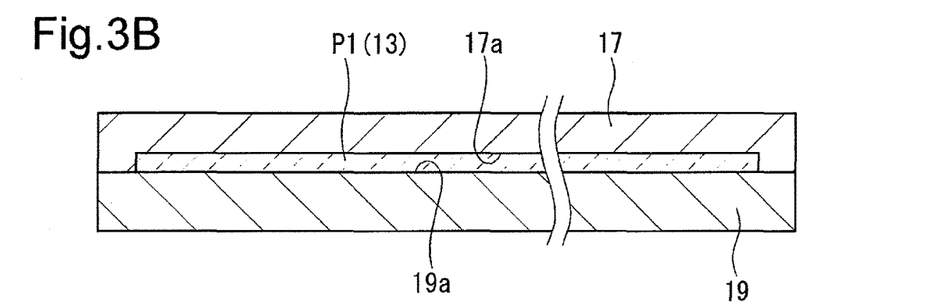
FIG. 3B is a cross-sectional view showing the first molding die and the second molding die when a process for injecting a transparent member is performed.

As shown in FIG. 3B, in a first injection process, a molten resin P1 that forms the transparent plate 13 is injected into the cavity C1.

Figure 3C:
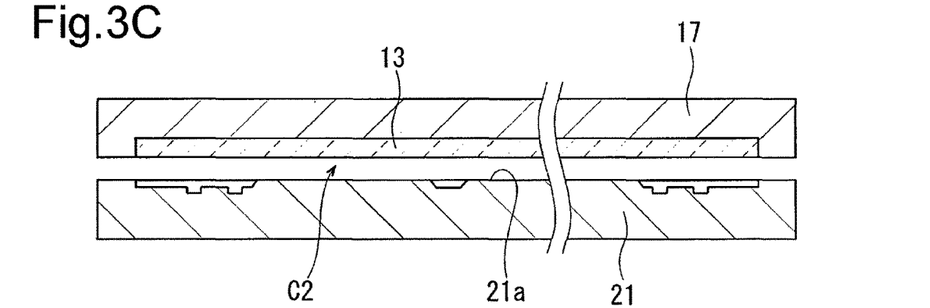
FIG. 3C is a cross-sectional view showing the transparent member, the first molding die and a third molding die.

As shown in FIG. 3C, in a first die opening process, the first molding die 17 and the second molding die 19 are opened after the molten resin P1 is solidified. This forms the tetragonal flat transparent plate 13. In the first die opening process, the first molding die 17 is not separated from the transparent plate 13.

As shown in FIG. 3C, in a second preparation process, the second molding die 19 is replaced with a third molding die 21.

The third molding die 21 includes a third molding surface 21a that molds the shield 15, that is, the body 150a and the connection portions 150b of the shield 15. Without separating the first molding die 17 from the transparent plate 13, the rear surface 13b of the transparent plate 13 and the third molding surface 21a are opposed to each other and the first molding die 17 and the third molding die 21 are closed. As a result, the transparent plate 13 and the third molding surface 21a define a cavity C2. Gates (not shown) are in communication with the cavity C2.

Figure 3D:
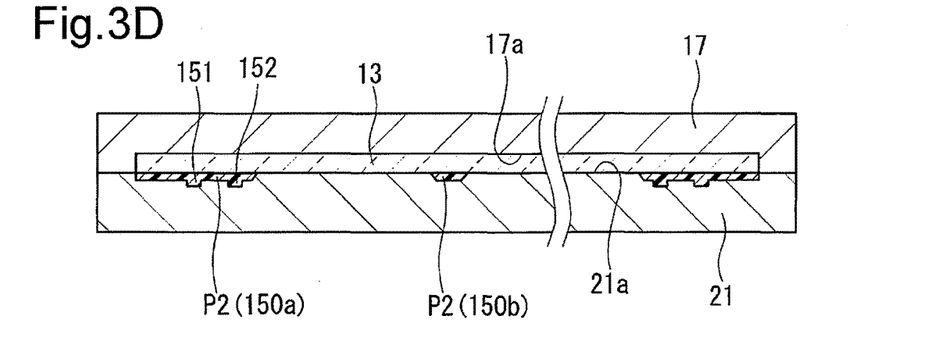
FIG. 3D is a cross-sectional view showing the transparent member, the first molding die, and the third molding die when a process for injecting an opaque member is performed.

As shown in FIG. 3D, in a second injection process, a molten resin P2 that forms the shield 15 is injected into the cavity C2.

Solidification of the molten resin P2 forms the body 150a and the connection portions 150b. At the same time, the ribs 151 and 152 are formed on the body 150a. Subsequently, in a second die opening process, the first molding die 17 and the third molding die 21 are opened. This forms the protection plate 1 that includes the shield 15 arranged on the rear surface 13b of the transparent plate 13 and integrated with the transparent plate 13 as shown in FIG. 2.

The protection plate 1 includes a portion where the body 150a and the connection portion 150b of the shield 15 are arranged on the rear surface 13b of the transparent plate 13 and a portion where the shield 15 is not arranged on the rear surface 13b. That is, the protection plate 1 includes a portion that includes the transparent plate 13 and the shield 15 and a portion that includes only the transparent plate 13. As described above, the rear surface 13b of the transparent plate 13 is flat. Thus, the portion of the protection plate 1 that includes the transparent plate 13 and the shield 15 is thicker than the portion of the protection plate 1 that includes only the transparent plate 13. In other words, when the shield 15 is arranged on the rear surface 13b of the transparent plate 13, the rear surface of the protection plate 1 includes recesses and projections.

Crystal silicon is used for the photovoltaic battery cells 3 of FIG. 1. The photovoltaic battery cells 3 are arranged in a grid pattern in the vertical direction and in the lateral direction of the solar panel shown in FIG. 1. The size and number of the photovoltaic battery cells 3 may be changed in accordance with the size of the solar panel.

The tab wires 5a and 5b, each formed by a thin metal plate, are arranged at the right side or the left side of the solar panel at predetermined intervals. When the tab wires 5a and 5b are connected to electrodes (not shown) of the photovoltaic battery cells 3 that are adjacent in the vertical direction, the photovoltaic battery cells 3 are electrically connected to one another.

The interconnectors 7a and 7b are each formed by a thin metal plate. When the interconnectors 7a and 7b are connected to the electrodes (not shown) of the photovoltaic battery cells 3 that are adjacent in the lateral direction, the photovoltaic battery cells 3 are electrically connected to one another. The forms and numbers of the tab wires 5a and 5b and the interconnectors 7a and 7b may be changed. Further, the locations where the tab wires 5a and 5b and the interconnectors 7a and 7b are connected to the photovoltaic battery cells 3 may be changed.

Referring to FIG. 2, ethylene-vinyl acetate copolymer is used for the encapsulant 9. The encapsulant 9 includes encapsulant sheets 9a and 9b, which will be described below. The encapsulant 9 encapsulates and protects the photovoltaic battery cells 3, the tab wires 5a and 5b, and the interconnectors 7a and 7b so that the photovoltaic battery cells 3, the tab wires 5a and 5b, and the interconnectors 7a and 7b are not deteriorated by oxygen and moisture. In such an encapsulated state, the encapsulant 9 is integrated with and located between the protection plate 1 and the back panel 11, that is, the rear surface 13b of the transparent plate 13 or the rear surface 15b of the shield 15 and the back panel 11. That is, the encapsulant 9 is fixed to the protection plate 1 and the back panel 11. In other words, the encapsulant 9 fixes the photovoltaic battery cells 3, the tab wires 5a and 5b, and the interconnectors 7a and 7b to the protection plate 1 and the back panel 11. Polyvinyl butyral (PVB) and polyethylene (PE) may be used as an encapsulant.

The back panel 11 is formed by a metal plate of aluminum alloy or the like. The back panel 11, which is arranged on the rear surface of the encapsulant 9, cooperates with the encapsulant 9 to protect the photovoltaic battery cells 3, the tab wires 5a and 5b, and the interconnectors 7a and 7b from deterioration caused by moisture and oxygen. When the protection plate 1 has insufficient rigidity, the back panel 11 ensures the rigidity of the solar panel. The back panel 11 may be formed from a resin such as carbon-fiber-reinforced plastic (CFRP). When the protection plate 1 is rigid enough to obtain the rigidity of the solar panel, a thin film of polyetherketone (PEK) may be used as the back cover instead of the back panel 11.

Figure 4A:
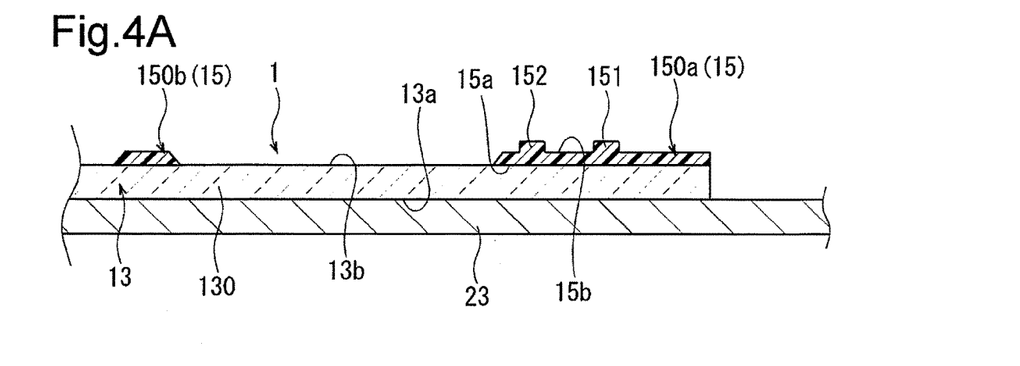
FIG. 4A is a cross-sectional view showing a vacuum forming jig and the protection plate.

The solar panel is manufactured as follows. First, as shown in FIG. 4A, a vacuum molding jig 23 that can be heated is prepared. The protection plate 1 is mounted on the vacuum molding jig 23 so that the front surface 13a of the transparent plate 13 opposes the vacuum molding jig 23.

Figure 4B:
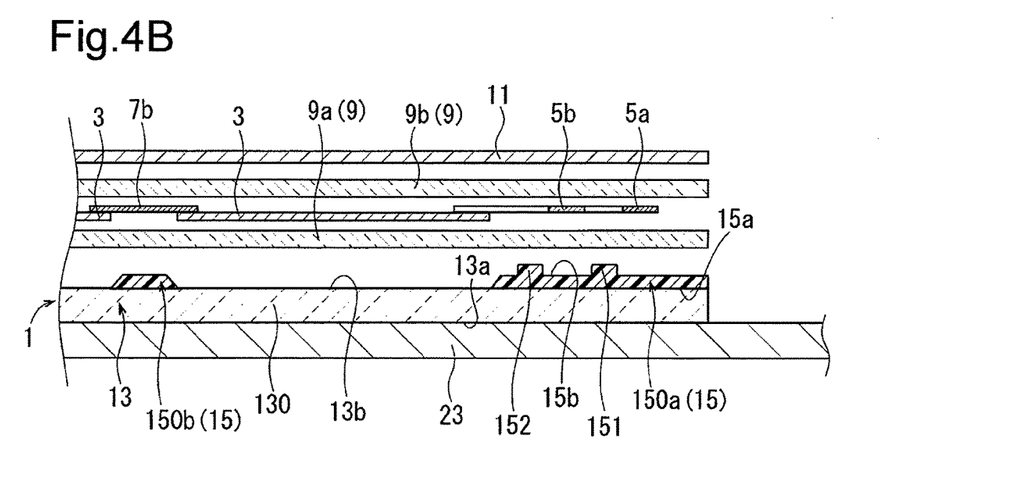
FIG. 4B is a cross-sectional view showing the vacuum forming jig, the protection plate, a photovoltaic battery cell, a conductive member, an encapsulant, and a back cover when an encapsulating process is performed.

As shown in FIG. 4B, in an encapsulating process, the encapsulant sheet 9a, a group of photovoltaic battery cells (photovoltaic battery cells 3, tab wires 5a and 5b, and interconnectors 7a and 7b), the encapsulant sheet 9b, and the back panel 11 are sequentially arranged on the rear surface of the protection plate 1. The photovoltaic battery cells 3 are electrically connected to one another by the tab wires 5a and 5b and the interconnectors 7a and 7b.

Figure 4C:
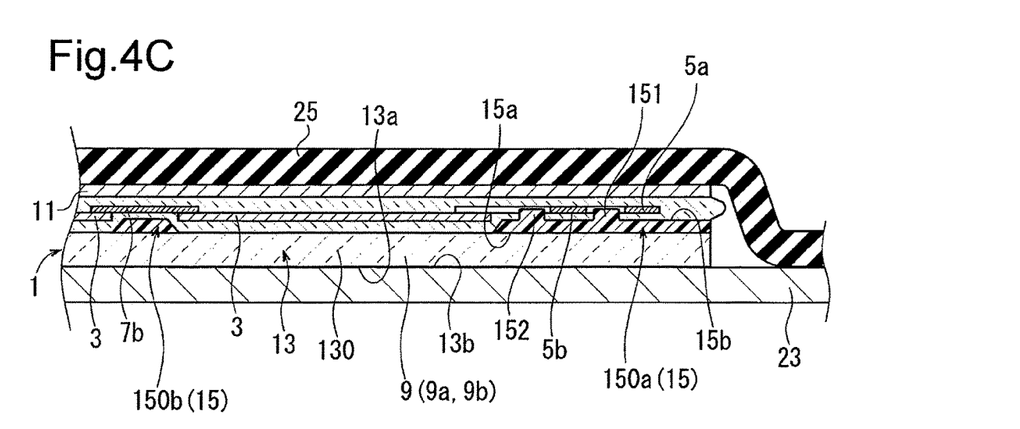
FIG. 4C is a cross-sectional view showing the vacuum forming jig, a die, and the solar panel.
Figure 5:
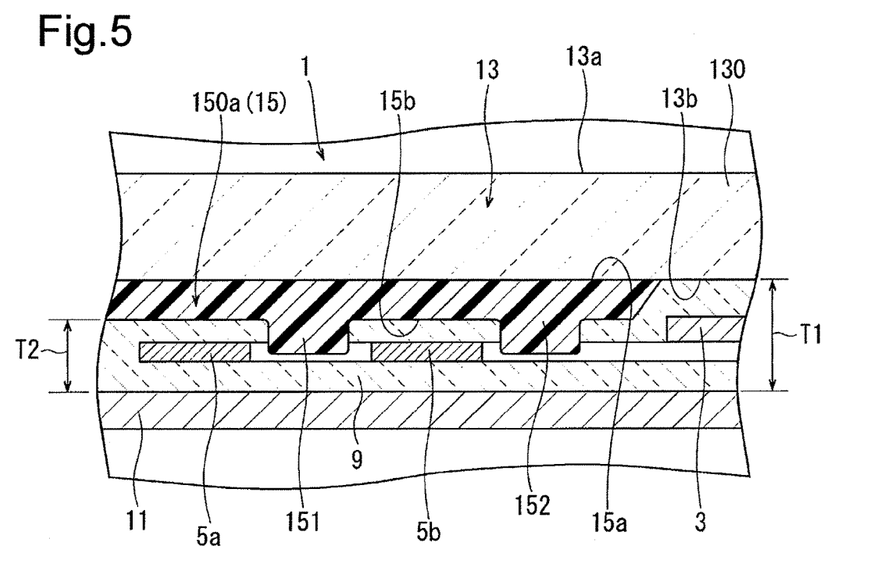
FIG. 5 is an enlarged cross-sectional view showing the main section of area X shown in FIG. 2.

Subsequently, a lamination process is performed. More specifically, as shown in FIG. 4C, a diaphragm 25 is pressed toward the vacuum molding jig 23 and a vacuum state is produced in the space between the vacuum molding jig 23 and the diaphragm 25. This eliminates air from between the members of the solar panel. Further, the vacuum molding jig 23 is heated when pressing the diaphragm 25 to soften the encapsulant sheets 9a and 9b and adhere the members to each other. Thus, the group of photovoltaic battery cells (photovoltaic battery cells 3, tab wires 5a and 5b, and interconnectors 7a and 7b) are encapsulated between the rear surface of the protection plate 1 and the back panel 11, more specifically, between the rear surface 13b of the transparent plate 13 or the rear surface 15b of the shield 15 and the back panel 11. Further, the group of photovoltaic battery cells is fixed to the protection plate 1 and the back panel 11. As shown in FIG. 5, the rib 151 of the body 150a is arranged between the tab wire 5a and the tab wire 5b, and the rib 152 of the body 150a is arranged between the tab wire 5b and the photovoltaic battery cell 3.

As shown in FIG. 4C, the encapsulant 9 that is forced out of the protection plate 1 and the back panel 11 during the lamination process is cut away. This forms the solar panel.

As described above, the portion of the protection plate 1 that includes the transparent plate 13 and the shield 15 is thicker than the portion of the protection plate 1 that includes only the transparent plate 13. As shown in FIG. 5, the section of the encapsulant 9 fixed to the portion of the protection plate 1 that includes only the transparent plate 13, that is, the section of the encapsulant 9 fixed to the rear surface 13b of the transparent plate 13 has thickness T1. The section of the encapsulant 9 fixed to the portion of the protection plate 1 that includes the transparent plate 13 and the shield 15, that is, the section of the encapsulant 9 fixed to the rear surface 15b of the body 150a and the connection portions 150b has thickness T2, which is smaller than the thickness T1.

As shown in FIG. 2, the photovoltaic battery cells 3 encapsulated by the encapsulant 9 oppose the opposing portions 130 on the rear surface 13b of the transparent plate 13. The tab wires 5a and 5b are arranged on the rear surface 15b of the body 150a of the shield 15. The interconnectors 7a and 7b are arranged on the rear surface 15b of the connection portions 150b of the shield 15. As shown in FIG. 5, the photovoltaic battery cells 3 are arranged at a portion where the encapsulant 9 has the thickness T1. Except for the portions connected to the photovoltaic battery cells 3, the tab wires 5a and 5b and the interconnectors 7a and 7b are arranged at a portion where the encapsulant 9 has the thickness T2.

In this manner, the protection plate 1 of the solar panel includes the transparent plate 13 and the shield 15, which is arranged on the rear surface 13b of the transparent plate 13 and integrated with the transparent plate 13. The tab wires 5a and 5b are arranged on the rear surface 15b of the body 150a of the shield 15. The interconnectors 7a and 7b are arranged on the rear surface 15b of the connection portions 150b of the shield 15. This allows the body 150a and the connection portions 150b to shield the tab wires 5a and 5b and the interconnectors 7a and 7b, respectively. Accordingly, even when the solar panel is viewed from the front side of the protection plate 1, the tab wires 5a and 5b and the interconnectors 7a and 7b are hidden and cannot be seen.

The protection plate 1 includes the transparent plate 13 that is formed from the molten resin P1 and the shield 15 that is formed from the molten resin P2. Thus, when forming the protection plate 1, portions that shield the tab wires 5a and 5b and the interconnectors 7a and 7b can be simultaneously formed in the protection plate 1. This allows the protection plate 1 to be formed more easily than when applying opaque paint to the necessary portions of a transparent protection plate formed from inorganic glass.

Accordingly, the solar panel according to the first embodiment improves the aesthetic appeal and decreases the manufacturing cost.

The portions of the transparent plate 13 that oppose the photovoltaic battery cells 3 define the opposing portions 130. The shield 15 projects from the rear surface 13b of the transparent plate 13 toward the encapsulant 9. The body 150a and the connection portions 150b of the shield 15 are arranged to surround the opposing portions 130.

Thus, the body 150a and the connection portions 150b, which are located around the opposing portions 130, allow for positioning of the photovoltaic battery cells 3. Accordingly, even when the solar panel expands and contracts due to temperature changes, the body 150a and the connection portions 150b limit displacement of the photovoltaic battery cells 3 from the opposing portions 130. This limits deterioration of the aesthetic appeal that would be caused by displacement of the photovoltaic battery cells 3 from the opposing portions 130. This also limits situations in which the body 150*a* and the connection portions 150*b* cover parts of the photovoltaic battery cells 3 that are displaced from the opposing portions 130. Accordingly, the decrease in the power generation efficiency is limited.

Additionally, the body 150*a* of the shield 15 includes the ribs 151 and 152 that project toward the encapsulant 9. The rib 151 is arranged between the tab wire 5*a* and the tab wire 5*b*, and the rib 152 is arranged between the tab wire 5*b* and the photovoltaic battery cell 3. Thus, even when the solar panel expands and contracts due to temperature changes, the ribs 151 and 152 restrict movement of the tab wires 5*a* and 5*b* and limit displacement of the tab wires 5*a* and 5*b* from the photovoltaic battery cells 3. This limits deterioration of the aesthetic appeal that would be caused when the tab wires 5*a* and 5*b* partially oppose the opposing portions 130 due to expansion and contraction of the solar panel resulting from temperature changes. This also limits contact failure of the tab wires 5*a* and 5*b* with the photovoltaic battery cells 3 and short-circuiting of the tab wires 5*a* and 5*b* that would be caused by displacement of the tab wires 5*a* and 5*b* from the photovoltaic battery cells 3.

Second Embodiment

Figure 6:
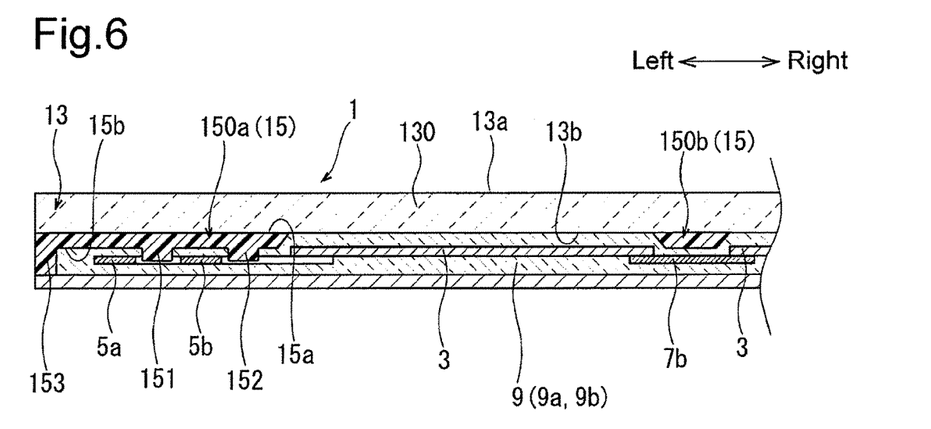
FIG. 6 is an enlarged cross-sectional view showing a solar panel of a second embodiment that corresponds to the cross section taken along line 2-2 in FIG. 1.

As shown in FIG. 6, a solar panel of the second embodiment includes a wall 153. The wall 153 is integrated with the body 150*a* of the shield 15 together with the ribs 151 and 152. The wall 153, which has the form of a frame, extends from the rear surface 15*b* of the body 150*a* toward the encapsulant 9 to surround the encapsulant 9 from the outside. The third molding surface 21*a* of the third molding die 21 includes a recess corresponding to the wall 153 to simultaneously form the wall 153 and the body 150*a*.

In the solar panel, when the group of photovoltaic battery cells (photovoltaic battery cells 3, tab wires 5*a* and 5*b*, and interconnectors 7*a* and 7*b*) encapsulated by the encapsulant 9 are arranged between the protection plate 1 and the back panel 11, the wall 153 abuts against the back panel 11. The remaining structure of the solar panel is the same as the solar panel of the first embodiment. Like or same reference numerals are given to those components that are the same as the corresponding components of the first embodiment and will not be described in detail.

Since the wall 153 surrounds the encapsulant 9 from the outside, rainwater would not enter the gaps extending between the protection plate 1 and the encapsulant 9. Further, even when the solar panel expands and contracts due to temperature changes, the wall 153 restricts relative displacement of the protection plate 1 and the encapsulant 9. Accordingly, the wall 153 limits situations in which the shield 15 partially shields the photovoltaic battery cells 3 and situations in which parts of the tab wires 5*a* and 5*b* and parts of the interconnectors 7*a* and 7*b* oppose the opposing portions 130. Moreover, the wall 153 limits situations in which the encapsulant 9 is forced out of the protection plate 1 and the back panel 11 when the lamination process is performed. This omits the process for cutting away the encapsulant 9 that is forced out of the protection plate 1 and the back panel 11 and thus reduces the manufacturing cost. The solar panel of the second embodiment also has the same advantages as the solar panel of the first embodiment.

Third Embodiment

Figure 7:
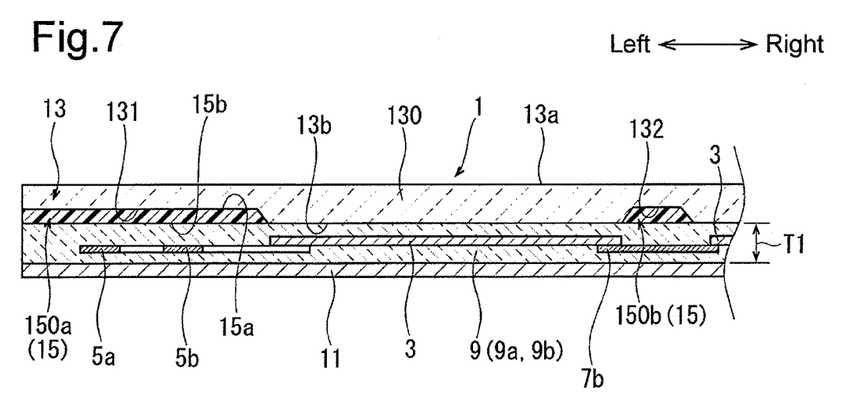
FIG. 7 is an enlarged cross-sectional view showing a solar panel of a third embodiment that corresponds to the cross section taken along line 2-2 in FIG. 1.

As shown in FIG. 7, a solar panel of the third embodiment includes a first recess 131 and second recesses 132 that are formed on the rear surface 13*b* of the transparent plate 13, which differs from the solar panel of the first embodiment. In the solar panel of the third embodiment, the body 150*a* of the shield 15 does not include the ribs 151 and 152. FIG. 7 shows one of the second recesses 132.

Parts of the rear surface 13*b* are respectively recessed toward the front surface 13*a* to form the first recess 131 and the second recesses 132. The first recess 131, which has the form of a frame, is recessed to surround the group of the opposing portions 130. The second recesses 132 are located at the inner side of the first recess 131 and are continuous with the upper side and lower side of the first recess 131. The second molding surface 19*a* of the second molding die 19 includes projections corresponding to the first recess 131 and the second recesses 132 to simultaneously form the first recess 131, the second recesses 132, and the transparent plate 13. In the solar panel of the third embodiment, the third molding surface 21*a* of the third molding die 21 is flat.

In the protection plate 1, the body 150*a* of the shield 15 is arranged in the first recess 131 and integrated with the transparent plate 13. The connection portions 150*b* are arranged in the second recesses 132 and integrated with the transparent plate 13. In this manner, the shield 15 is arranged on the rear surface 13*b* of the transparent plate 13 and integrated with the transparent plate 13. The body 150*a* and the connection portions 150*b* are respectively arranged in the first recess 131 and the second recesses 132, and the ribs 151 and 152 are not formed in the body 150*a*. Since the rear surface 13*b* of the transparent plate 13 (more specifically, the rear surface 13*b* located at a portion of the opposing portion 130) is coplanar to the rear surface 15*b* of the shield 15, the rear surface of the protection plate 1 does not include recesses and projections. Thus, the portion of the protection plate 1 that includes the transparent plate 13 and the shield 15 has the same thickness as the portion of the protection plate 1 that includes only the transparent plate 13. The remaining structure of the solar panel of the third embodiment is the same as the solar panel of the first embodiment.

Since the rear surface 13*b* of the transparent plate 13 and the rear surface 15*b* of the shield 15 are coplanar, a portion of the encapsulant 9 located between the opposing portion 130 and the back panel 11 has the same thickness T1 as a portion of the encapsulant 9 located between the body 150*a* or the connection portion 150*b* and the back panel 11. The entire thickness T1 of the encapsulant 9 allows the encapsulant 9 to encapsulate the photovoltaic battery cells 3, the tab wires 5*a* and 5*b*, and the interconnectors 7*a* and 7*b* and fix the photovoltaic battery cells 3, the tab wires 5*a* and 5*b*, and the interconnectors 7*a* and 7*b* to the protection plate 1 and the back panel 11 in a favorable manner. The solar panel of the third embodiment also has the same advantages as the solar panel of the first embodiment.

Although the present invention has been described as above according to the first to third embodiments, the present invention is not limited to the first to third embodiments. It should be apparent to those skilled in the art that the present invention may be embodied in many other specific forms without departing from the spirit or scope of the invention. Particularly, it should be understood that the present invention may be embodied in the following forms.

For example, the first to third embodiments may be combined to form a solar panel.

The solar panel of each of the first to third embodiments may be curved. In this case, the form of the shield 15 may be changed in accordance with the form of the rear surface 13*b* of the curved transparent plate 13.

The shield 15 may be arranged closer to the front surface 13a of the transparent plate 13 than the rear surface 13b of the transparent plate 13 (more specifically, the rear surface 13b located at a portion of the opposing portion 130).

The shield 15 may include only the body 150a.

The present invention is applicable to a solar panel mounted on a vehicle roof and a solar panel used for a solar power generation system.

The present examples and embodiments are to be considered as illustrative and not restrictive, and the invention is not to be limited to the details given herein, but may be modified within the scope and equivalence of the appended claims.

The invention claimed is:

1. A solar panel comprising:
   a protection plate;
   a back cover;
   photovoltaic battery cells;
   a conductive member that electrically connects the photovoltaic battery cells to one another; and
   an encapsulant that is integrated with and located between the protection plate and the photovoltaic battery cells and between the photovoltaic battery cells and the back cover, wherein the encapsulant encapsulates the photovoltaic battery cells and the conductive member and fixes the photovoltaic battery cells and the conductive member to the protection plate and the back cover, wherein
   the protection plate consists of a single resin transparent member, which is translucent from a front surface to a rear surface, and a resin opaque member, which is located at an outer side of each of the photovoltaic battery cells, shields the conductive member, and is directly attached to the rear surface of the single resin transparent member and integrated with the single resin transparent member,
   the single resin transparent member includes an opposing portion that opposes each of the photovoltaic battery cells,
   the resin opaque member surrounds the opposing portion,
   the resin opaque member includes a plurality of ribs, wherein the plurality of ribs are connected to each other by a portion of the resin opaque member that has a smaller thickness than the thickness of the ribs, wherein the plurality of ribs restricts movement of the conductive member relative to the single resin transparent member and the resin opaque member, and wherein the plurality of ribs project toward the encapsulant.

2. The solar panel according to claim 1, wherein the resin opaque member includes a wall that surrounds the encapsulant.

3. The solar panel according to claim 1, wherein the conductive member includes two tab wires, and one of the plurality of ribs is arranged between the two tab wires.

* * * * *